United States Patent
Henzler et al.

(10) Patent No.: US 9,130,588 B2
(45) Date of Patent: Sep. 8, 2015

(54) REDUNDANT DELAY DIGITAL-TO-TIME CONVERTER

(71) Applicant: Intel Mobile Communications GmbH, Neubiberg (DE)

(72) Inventors: Stephan Henzler, Munich (DE); Markus Schimper, Moosinning (DE); Paolo Madoglio, Beaverton, OR (US); Stefano Pellerano, Beaverton, OR (US); Kailash Chandrashekar, Hillsboro, OR (US)

(73) Assignee: Intel Mobile Communications GmbH, Neubiberg (DE)

( * ) Notice: Subject to any disclaimer, the term of this patent is extended or adjusted under 35 U.S.C. 154(b) by 143 days.

(21) Appl. No.: 13/839,480

(22) Filed: Mar. 15, 2013

(65) Prior Publication Data

US 2014/0266837 A1     Sep. 18, 2014

(51) Int. Cl.
*H03H 11/26* (2006.01)
*H03M 1/82* (2006.01)
*H03K 5/13* (2014.01)
*H03L 7/08* (2006.01)

(52) U.S. Cl.
CPC ............. *H03M 1/82* (2013.01); *H03K 5/131* (2013.01); *H03L 7/08* (2013.01)

(58) Field of Classification Search
USPC .............. 327/276–283, 261–264; 341/145
See application file for complete search history.

(56) References Cited

U.S. PATENT DOCUMENTS

| | | | | |
|---|---|---|---|---|
| 5,963,074 A * | 10/1999 | Arkin | | 327/276 |
| 6,774,694 B1 * | 8/2004 | Stern et al. | | 327/276 |
| 2008/0291080 A1 * | 11/2008 | Wilens et al. | | 342/176 |
| 2013/0293275 A1 * | 11/2013 | Granhaug et al. | | 327/285 |

* cited by examiner

*Primary Examiner* — Lincoln Donovan
*Assistant Examiner* — Thomas Skibinski
(74) *Attorney, Agent, or Firm* — Schwegman Lundberg & Woessner, P.A.

(57) ABSTRACT

Representative implementations of devices and techniques provide a time delay based on an input value. A digital delay may be generated based on a coarse delay and a fine delay. The coarse delay may be selected based on the input value. The fine delay may be selected from an overlapping set of fine delay intervals, based on the selected coarse delay. In some implementations, a control component may be used to select the fine delay when more than one fine delay interval is indicated.

5 Claims, 5 Drawing Sheets

REDUNDANT DELAY DIGITAL-TO-TIME CONVERTER

BACKGROUND

Digital-to-time converters (DTC) are promising building blocks for future phase modulators, as well as for use in pulse width modulation, and the like. A DTC is a building block which delays incoming signal edges according to digital tuning information at its input. For example, a DTC may convert a digital signal or a digital value to a time delay. It may provide particular delays that can be used for triggering, syncing, delaying, and/or gating certain events. In a phase modulator, for instance, the DTC may act as a variable delay element which alters the phase of an incoming quasi periodic signal by dynamically changing its delay.

There are some multi-stage approaches that are currently used to construct high dynamic range DTCs. For example, in a first stage, coarse delays may be generated by selecting coarse phases of the input signal. In a second stage, an independent delay element may be used to interpolate in between the coarse phases. Problems may emerge, however, if the tuning range of the independent delay element does not fit perfectly into the coarse intervals. This may happen, for instance, when the gain of the independent delay is not perfectly known and/or due to variations of the coarse delay elements.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques convert a digital signal or a digital value into a time delay. A digital time delay may be generated based on a combination of a coarse delay and a fine delay. The coarse delay may be selected based on the input value, for example. The fine delay may be selected from an overlapping set of fine delay intervals, based on the selected coarse delay. In some implementations, a control component may be used to select the fine delay when more than one fine delay interval is indicated, based on the selected coarse delay.

In an implementation, a random or pseudo-random generator may be used to select the fine delay interval when more than one fine delay interval of the set of overlapping fine delay intervals is indicated. In a further implementation, a calibration component may be arranged to dynamically provide calibration of the fine delay intervals and/or scale the input value to fit the fine delay intervals to the coarse delay intervals. When the fine delay intervals fit the coarse delay intervals, a precise delay may be generated based on the input value without gaps or steps between intervals.

Various implementations and techniques for delay arrangements are discussed in this disclosure. Techniques and devices are discussed with reference to example delay circuits illustrated in the figures. However, this is not intended to be limiting, and is for ease of discussion and illustrative convenience. The techniques and devices discussed may be applied to various delay circuit designs, structures, devices, and the like, and remain within the scope of the disclosure.

Implementations are explained in more detail below using a plurality of examples. Although various implementations and examples are discussed here and below, further implementations and examples may be possible by combining the features and elements of individual implementations and examples.

Example Delay Circuit

Figure 1:
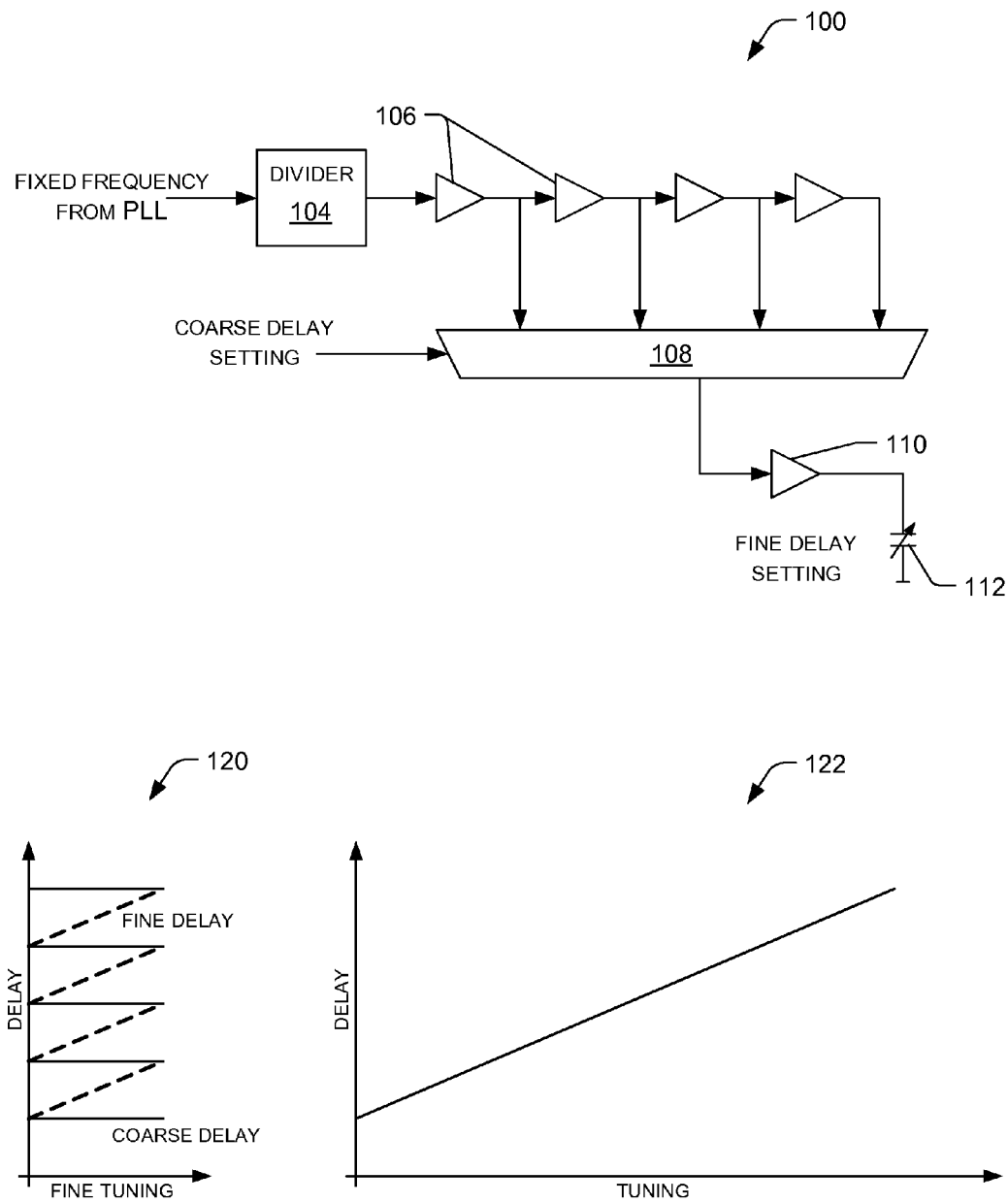
FIG. 1 is a schematic diagram of an example delay circuit, wherein the techniques and devices disclosed herein may be applied, according to an implementation. An example delay characteristic is also shown, in the form of a pair of graphs.

FIG. 1 is a schematic diagram of an example delay circuit 100, wherein the techniques and devices disclosed herein may be applied, according to an implementation. An example delay characteristic is also shown, in the form of a pair of graphs 120, 122.

In general, the delay circuit 100 produces a desired time delay to an input frequency (e.g., "fixed frequency from PLL"). In other words, the delay circuit 100 delays incoming signal edges according to tuning information at its input. In various implementations, the input frequency may be supplied by a phase-locked-loop (PLL), or the like. The input frequency may be divided by a divider 104, for example, and then passed through one or more coarse delay elements 106, based on the desired delay.

In an implementation, a coarse delay is generated by selecting coarse phases of the input signal. For example, the coarse phases may be based on the divider 104, dividing the input frequency in preparation for passing the resulting signal through the one or more delay elements 106.

In an implementation, each coarse delay element 106 adds a predetermined amount of delay time (e.g., 100 ns, etc.) to the output delay. Accordingly, a desired coarse delay duration may be produced by accumulating a quantity of delay times from the one or more delay elements 106 (e.g., passing through three coarse delay elements 106 may result in 3×100 ns=300 ns of time delay, etc.). In one example, the coarse delay elements 106 are a fixed delay interval from each other. This is represented in the example delay characteristic graph 120, as shown in FIG. 1 (i.e., "COARSE DELAY") with the solid-line delay intervals.

In an implementation, the coarse delay interval is accumulated with a multiplexer 108, for example. In one implementation, the delay circuit 100 includes a fine delay stage 110 having a finer delay increment (e.g., 2 ns, 5 ns, 10 ns, etc.) than the coarse delay interval. This second stage may include an independent delay element 112 with fine tuning capability, used to interpolate in between the coarse phases. In other words, the fine delay intervals may interpolate between each of the coarse delay intervals, as shown in the example delay characteristic 120 of FIG. 1, by the dashed lines (i.e., "FINE DELAY"). In alternate implementations, an example delay circuit 100 may include fewer, additional, or alternate components.

If the fine delay intervals fit well to the coarse delay intervals, the result is the ideal tuning curve 122, as shown in FIG. 1. The ideal tuning curve 122 is shown free from gaps, steps, etc. based on fine tuning intervals that ideally interpolate between each of the coarse delay intervals (as shown in the graph 120, for example).

Figure 2:
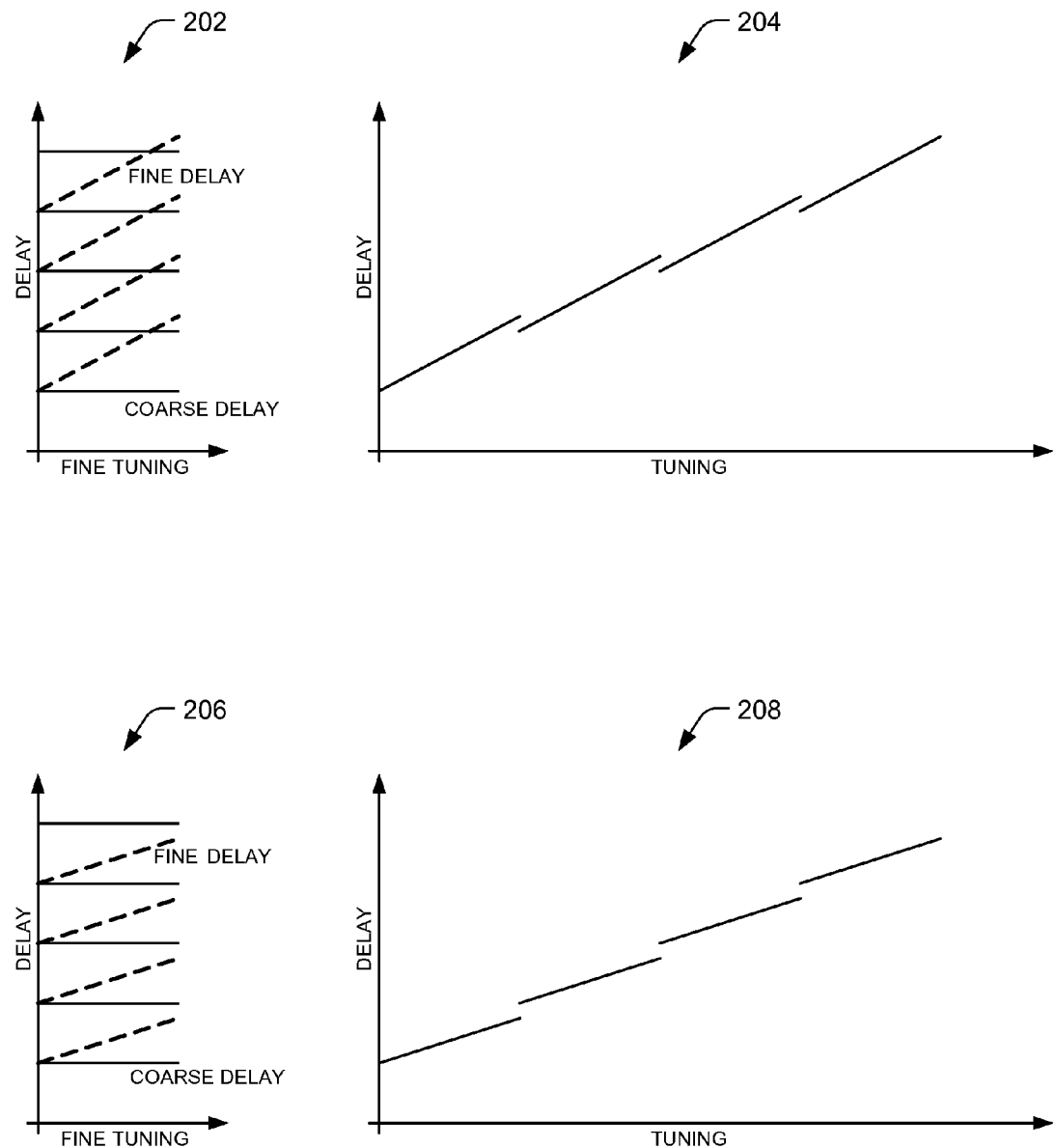
FIG. 2 illustrates a pair of delay characteristics, each shown in the form of a pair of graphs, according to two examples.

Problems emerge, however, if the tuning range of the fine delay stage 110 does not fit perfectly into the coarse intervals. This may happen in practice if the gain of the fine delay 110 is not perfectly known and/or due to variation of the coarse delay elements 106. The delay characteristic graphs of FIG. 2 show potential impacts of these possibilities. Large steps and even non-monotonic behavior may occur at the transitions between subsequent coarse steps. This is shown in the graphs 202 and 206, by the fine delay intervals (the dashed lines) not interpolating fully between the coarse delay intervals (the solid lines). It is also evidenced by the graphs 204 and 208, by the steps and/or gaps in the overall delay characteristic.

Example Redundant Delay Digital-to-Time Converter

In various implementations, the fine delay interpolation of a delay circuit (such as delay circuit 100, for example) can be improved, thereby improving the performance of the circuit 100, and reducing or removing gaps and/or steps in the delay characteristic for the range of the circuit 100.

Figure 3:
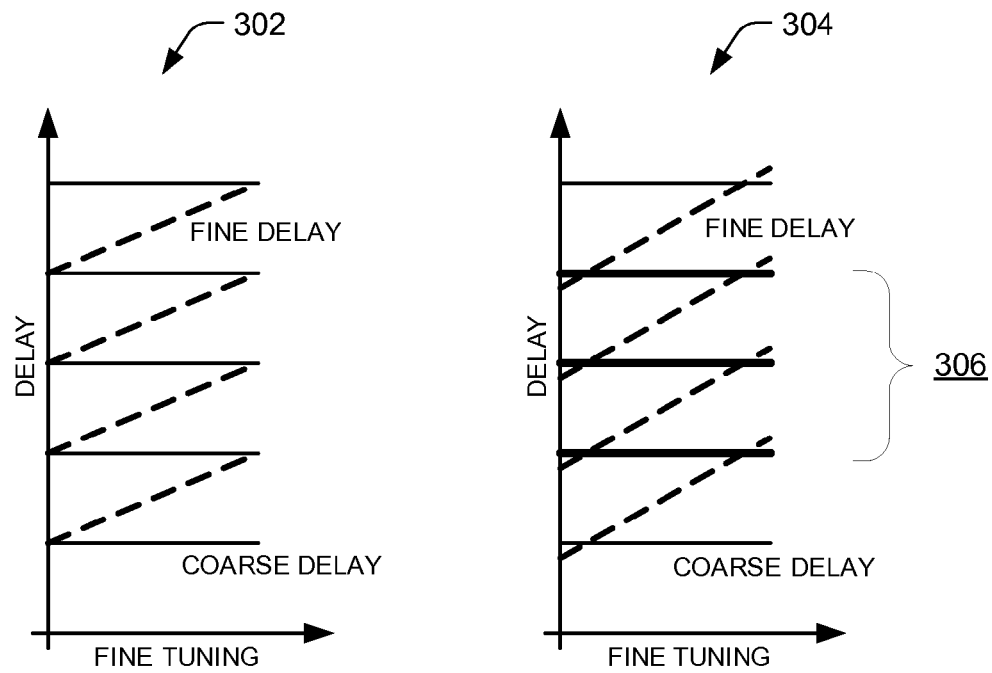
FIG. 3 illustrates a pair of delay characteristics, each shown in the form of a single graph, according to an implementation.

FIG. 3 illustrates a pair of delay characteristics 302 and 304, according to an implementation. The graph 302 represents the ideal delay characteristic (or a close approximation to the ideal characteristic) wherein the fine delay intervals (the dashed lines) are interpolated (or fit) between each of the coarse delay intervals (the solid lines). The delay characteristic 302 results in a delay curve as shown in FIG. 1 at 120, for example. In an implementation, a delay circuit 400 (see FIG. 4) may be used to produce the curve 302, based on producing the curve 304, as explained below.

Figure 4:
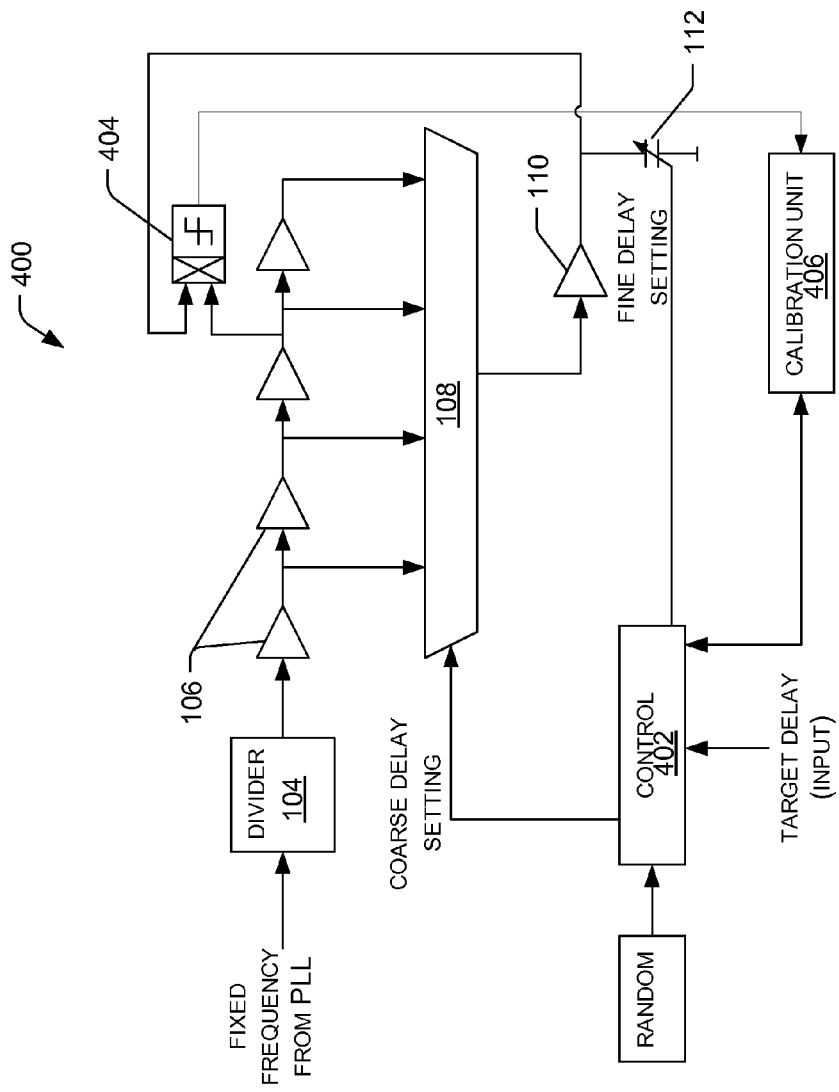
FIG. 4 is a schematic diagram of an example delay circuit utilizing a combination of a coarse delay stage and a fine delay stage, according to an implementation.

FIG. 4 is a schematic diagram of an example delay circuit 400 utilizing a combination of a coarse delay stage comprising one or more coarse delay elements 106 and a fine delay stage including a fine delay component 110 and a fine tuning element 112, according to an implementation. In one implementation, many of the features of the delay circuit 100, as discussed above, are also features of the delay circuit 400. However, the delay circuit 400 is arranged to use a set of overlapping fine delay intervals 306, as shown in FIG. 3 at 304, to generate a digital delay. For example, the coarse delay stage and the fine delay stage are arranged to generate a digital delay value based on the input signal.

In an implementation of the circuit 400, the coarse delay stage is arranged to select a coarse delay from a set of coarse time intervals, based on an input signal (i.e., "FIXED FREQUENCY FROM PLL") and the one or more delay components 106. In an example, the delay circuit 400 delays incoming signal edges according to tuning information at its input. In various implementations, the input frequency may be supplied by a phase-locked-loop (PLL), or the like. The input frequency may be divided by the divider 104, for example, and then passed through the one or more coarse delay elements 106, based on the desired delay.

In an implementation, the delay circuit 400 detects when the desired delay falls into an overlap region 306. For example, as shown in FIG. 3 at 304, an overlap region 306 comprises a subset of the set of coarse time intervals where more than one fine delay interval within the set of overlapping fine delay intervals intersects a coarse delay. For instance, the subset of coarse delay intervals where more than one fine delay intersects a coarse delay are shown in the heavy solid lines, at 306. For each of the coarse delay intervals of subset 306, more than one fine tuning interval may be used to fine tune the coarse delay to the desired delay value.

In one implementation, the fine delay stage is arranged to determine a fine delay interval from the set of overlapping fine delay intervals 306, based on the selected coarse delay. For example, in one implementation, the circuit 400 includes a control module 402 arranged to select the fine delay interval when more than one fine delay interval of the set of overlapping fine delay intervals 306 is indicated, based on the selected coarse delay. In various implementations, different techniques may be applied to determine the fine delay interval in this case.

In an implementation, the control module 402 is arranged to detect whether the selected coarse delay falls into a fine delay overlap region 306. The control module 402 is further arranged to determine whether an upper part of a first fine tuning interval or a lower part of a second fine tuning interval (as shown in FIG. 3 at 306) is determined by the fine delay stage.

In one example implementation, the control module 402 includes a random generator or a pseudo-random generator arranged to select the fine delay interval. In alternate implementations, other components, modules, etc. may be used to select the fine delay interval. In an implementation, the random or pseudo-random generator, determines which possible realization (i.e., fine delay interval) of the delay curve is chosen, i.e. whether the upper part of one fine delay interval or the lower part of another fine delay interval within the tuning characteristic is used. In an example, the random or pseudo-random generator uses a random or pseudo-random value to select the fine delay interval.

In an implementation, the resulting delay is compared to the respective selected coarse delay. For instance, a comparator 404 is arranged to compare an output of the coarse delay stage to an output of the fine delay stage.

In one implementation, one or more tuning values for the calibration circuit 404 are based on whether the determined fine delay interval leads or lags the selected coarse delay. For example, the comparator 404 may be arranged to compare the timing between the output of the fine delay stage and the output of the coarse delay stage. In other words, the comparator 404 detects whether the fine delay signal or the coarse delay signal arrives first. Based on this comparison, the tuning values for which the fine delay is equal to the coarse delay (e.g., the points of intersection of the fine delay intervals and the coarse delay intervals on the graph 304) can be computed. In one implementation, the tuning values are computed iteratively.

In an implementation, with the points of intersection of the fine delay intervals and the coarse delay intervals computed, the input signal is scaled based on those intersection points such that the fine tuning characteristics (i.e., the fine delay intervals) fit into the coarse time intervals, as shown in FIG. 3 at graph 302.

In an implementation, the delay circuit 400 includes a calibration circuit 406. In one implementation, the calibration circuit 406 is arranged to scale the input signal based on the one or more values where the fine delay interval intersects the coarse delay. For example, the calibration circuit 406 is arranged to scale the input signal such that the fine delay interval fits into a coarse time interval.

In an implementation, the calibration circuit 406 is arranged to take gain variations of the fine delay elements 110 and 112 and local variations of the coarse delay elements 106 into account and to correct for them dynamically. In particular, the calibration circuit 406 is arranged to automatically and dynamically calibrate the gain of the fine delay stage (or fine delay tuning element 112) based on an output of the comparator 404 and on the determined fine delay interval.

In another implementation, the calibration circuit 406 is arranged to update an estimation of a transition point associated with a transition from a first fine delay interval to a next fine delay interval based on an output of the comparator 404 and the determined fine delay interval.

As discussed above, the techniques, components, and devices described herein with respect to the implementations are not limited to the illustration of FIGS. 1-4, and may be applied to other delay devices, circuits, and designs without departing from the scope of the disclosure. In some cases, additional or alternative components may be used to implement the techniques described herein. Further, the components may be arranged and/or combined in various combinations, while resulting in a desired delay. It is to be understood that a delay circuit 400 may be implemented as a stand-alone device or as part of another system (e.g., integrated with other components, systems, etc.). In various implementations, additional or alternative components may be used to accomplish the disclosed techniques and arrangements.

Representative Process

Figure 5:
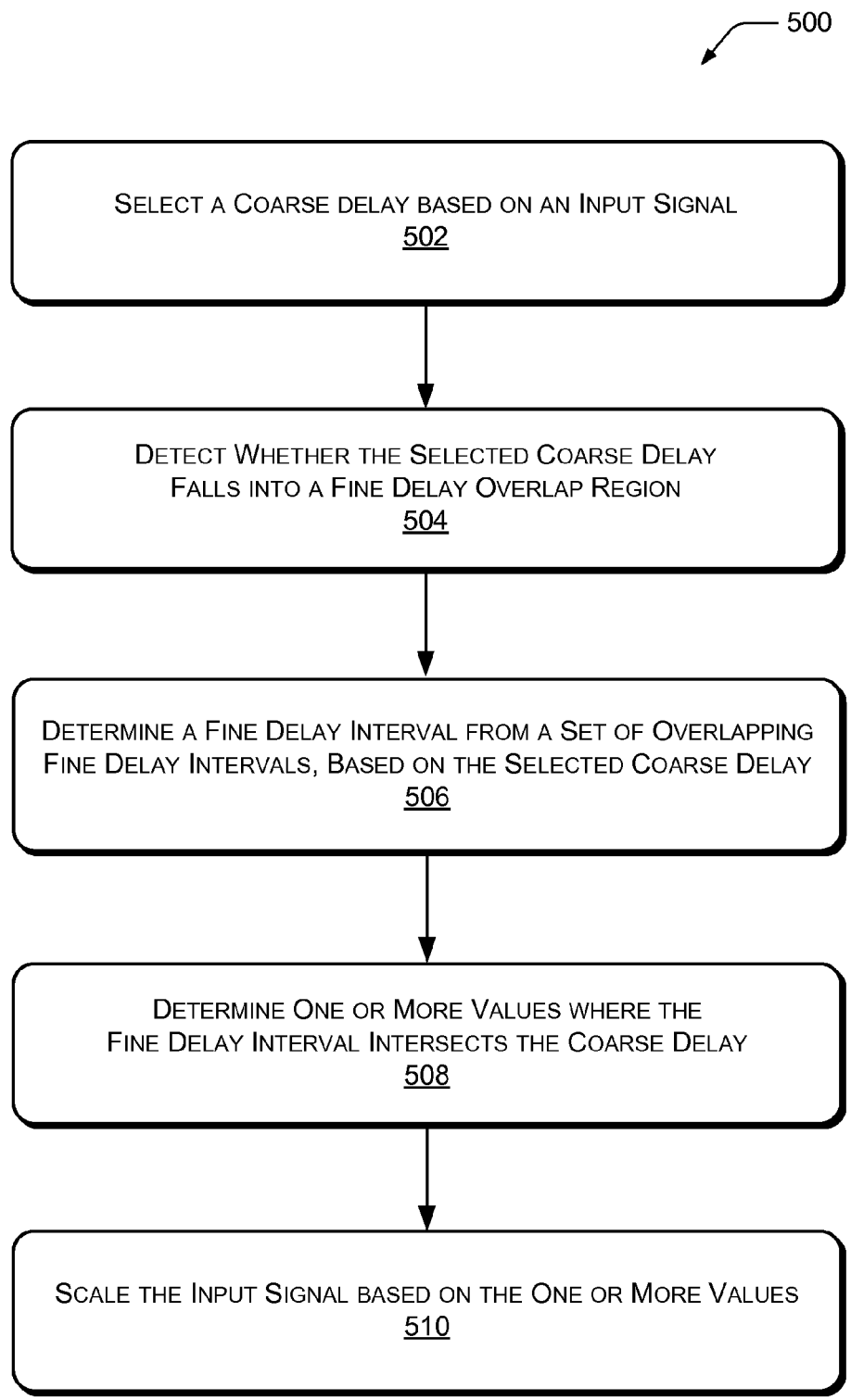
FIG. 5 is a flow diagram illustrating an example process for generating a digital delay based on overlapping fine delay intervals, according to an implementation.

FIG. 5 is a flow diagram illustrating an example process 500 for providing a desired delay using a delay circuit (such as delay circuit 400, for example) according to various implementations. The process 500 describes using a technique based on overlapping fine delay intervals. The process 500 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 502, the process 500 includes selecting a coarse delay based on an input signal. In an implementation, the coarse delay is selected from a set of coarse time delay intervals, for example. In various implementations, the input signal may be supplied by a PLL, or the like.

At block 504, the process includes detecting whether the selected coarse delay falls into a fine delay overlap region (such as delay overlap region 306, for example). In various implementations, the fine delay overlap region comprises a subset of the set of coarse time intervals where more than one fine delay interval within a set of overlapping fine delay intervals intersects a coarse delay.

In an implementation, the process includes tuning the fine delay intervals of the set of overlapping fine delay intervals to a greater time interval than the course time interval (see graph 304 of FIG. 3, for example).

At block 506, the process includes determining a fine delay interval from a set of overlapping fine delay intervals, based on the selected coarse delay. In an implementation, the process includes using a random or pseudo-random value to determine the fine delay interval when more than one fine delay interval within the set of overlapping fine delay intervals is indicated, based on the selected coarse delay. In one example, the process includes using a random or pseudo-random value to determine the fine delay interval when more than one fine delay interval within the set of overlapping fine delay intervals intersects the selected coarse delay.

At block 508, the process includes determining one or more values where the fine delay interval intersects the coarse delay.

At block 510, the process includes scaling the input signal based on the one or more values where the fine delay interval intersects the coarse delay. In an example, the process includes determining at least two values where the fine delay interval intersects the coarse delay and scaling the input signal based on the at least two values. In a further example, the process includes scaling the input signal such that the fine delay interval fits into a coarse time interval (see graph 302 of FIG. 3, for example).

In an implementation, the process includes comparing the determined fine delay interval to the selected coarse delay, and iteratively computing tuning values for which the fine delay interval is equal to the coarse delay. For example, in one implementation, the process includes comparing a timing of the fine delay interval to a timing of the coarse delay, and computing tuning values for which the fine delay is equal to the coarse delay based on whether the fine delay interval leads or lags the coarse delay.

In an implementation, the process includes dynamically calibrating a gain of a fine delay tuning component based on the comparing and on the determined fine delay interval. In an example, the process includes dynamically correcting for fine and/or local variations of coarse delay components.

In one implementation, the process includes generating a digital delay value based on the input signal, where the digital delay value is generated either with a (first) fine tuning of a lower coarse delay within the fine delay overlap region or by a (second) fine tuning of an upper coarse delay within the fine delay overlap region. For example, the first fine tuning is associated with a first fine delay interval and the second fine tuning is associated with a second fine delay interval. In the example, the first fine delay interval overlaps the second fine delay interval.

In alternate implementations, other techniques may be included in the process 500 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus configured to receive an input signal and a digital value representative of a target time delay and to provide a representation of the input signal delayed by the target time delay, the apparatus comprising:
   a control module configured to receive the digital value;
   a coarse delay stage arranged to receive the input signal and to provide a coarse delayed representation of the input signal using a selected coarse delay interval, the selected coarse delayed interval based on a coarse delay setting received from the controller; and
   a fine delay stage arranged to provide a fine delay interval from a set of overlapping fine delay intervals, based on a fine delay setting received from the controller,
   wherein a first fine delay interval selection from the set of overlapping fine delay intervals can provide the fine delay;

wherein a second fine delay interval selection from the set of overlapping fine delay intervals can provide the fine delay, the second fine delay selection different from the first fine delay selection;

wherein a combination of the selected course delay interval and the fine delay is configured to provide the target time delay; and wherein the control module includes a random generator arranged to select one of the first fine delay interval or the second fine delay interval.

2. The apparatus of claim 1, further comprising a comparator arranged to compare a timing of an output of the fine delay stage with an output of the coarse delay stage.

3. The apparatus of claim 2, further comprising a calibration circuit arranged to update an estimation of a transition point associated with a transition from a first fine delay interval to a next fine delay interval based on an output of the comparator and the determined fine delay interval.

4. The apparatus of claim 1, further comprising a calibration circuit arranged to scale the digital value based on one or more values where the fine delay interval intersects the coarse delay.

5. The apparatus of claim 4, wherein the calibration circuit is arranged to scale the digital value such that the set of overlapping fine delay intervals span each incremental coarse delay time interval.

* * * * *